United States Patent
Kim (10) Patent No.: US 11,817,851 B2
(45) Date of Patent: Nov. 14, 2023

(54) RF SWITCH DEVICE

(71) Applicant: DB HiTek Co., Ltd., Bucheon-si (KR)

(72) Inventor: Sang Gil Kim, Cheongju-si (KR)

(73) Assignee: DB HiTek, Co., Ltd., Bucheon-si (KR)

( * ) Notice: Subject to any disclaimer, the term of this patent is extended or adjusted under 35 U.S.C. 154(b) by 0 days.

(21) Appl. No.: 17/741,877

(22) Filed: May 11, 2022

(65) Prior Publication Data

US 2022/0368322 A1 Nov. 17, 2022

(30) Foreign Application Priority Data

May 12, 2021 (KR) .................. 10-2021-0061301

(51) Int. Cl.
*H03K 17/06* (2006.01)
*H03K 17/693* (2006.01)

(52) U.S. Cl.
CPC ......... *H03K 17/063* (2013.01); *H03K 17/693* (2013.01)

(58) Field of Classification Search
None
See application file for complete search history.

(56) References Cited

U.S. PATENT DOCUMENTS

| | | | | |
|---|---|---|---|---|
| 7,561,853 B2 * | 7/2009 | Miyazawa | ............... | H04B 1/44 327/566 |
| 8,401,496 B2 * | 3/2013 | Goto | .......... | H01P 1/15 455/26.1 |
| 8,723,260 B1 * | 5/2014 | Carroll | ............. | H01L 21/84 257/401 |
| 9,503,081 B2 * | 11/2016 | Yang | .......... | H03K 17/145 |
| 9,721,936 B2 * | 8/2017 | Zhu | .......... | H01L 29/41758 |
| 10,229,902 B2 * | 3/2019 | Zhu | .......... | H01L 29/42372 |
| 10,630,284 B2 * | 4/2020 | Ranta | ......... | H01L 23/5223 |
| 10,840,233 B2 * | 11/2020 | Zhu | .......... | H01L 29/41758 |
| 2012/0062321 A1 * | 3/2012 | Yamamoto | ........... | H03F 1/0277 330/296 |

FOREIGN PATENT DOCUMENTS

KR 10-2019-0127389 A 11/2019

* cited by examiner

*Primary Examiner* — Kenneth B Wells
(74) *Attorney, Agent, or Firm* — Andrew D. Fortney; Central California IP Group, P.C.

(57) ABSTRACT

Disclosed is an RF switch device and, more particularly, an RF switch device that reduces or eliminates a voltage imbalance by implementing at least one stage in a stacked switch device with a different width, and thus the voltage applied to each stage in the OFF state may be more equally distributed among the individual stages.

3 Claims, 10 Drawing Sheets

RF SWITCH DEVICE

CROSS REFERENCE TO RELATED APPLICATION(S)

The present application claims priority to Korean Patent Application No. 10-2021-0061301, filed on May 12, 2021, the entire contents of which are incorporated herein by reference.

TECHNICAL FIELD

The present disclosure relates to an RF switch device and, more particularly, to an RF switch device that reduces or eliminates a voltage imbalance by implementing at least one stage in a stacked switch device with a different width, and thus the voltage applied to each stage in the OFF state may be more equally distributed among the individual stages.

BACKGROUND ART

In general, a radio frequency front-end module (RF FEM) used in wireless communication devices such as a mobile phone, a smartphone, a notebook computer, a tablet PC, a PDA, a mobile game device, a multimedia device, etc. may include an RF active device, an RF passive device, an RF switch device, and a control device.

Figure 1:
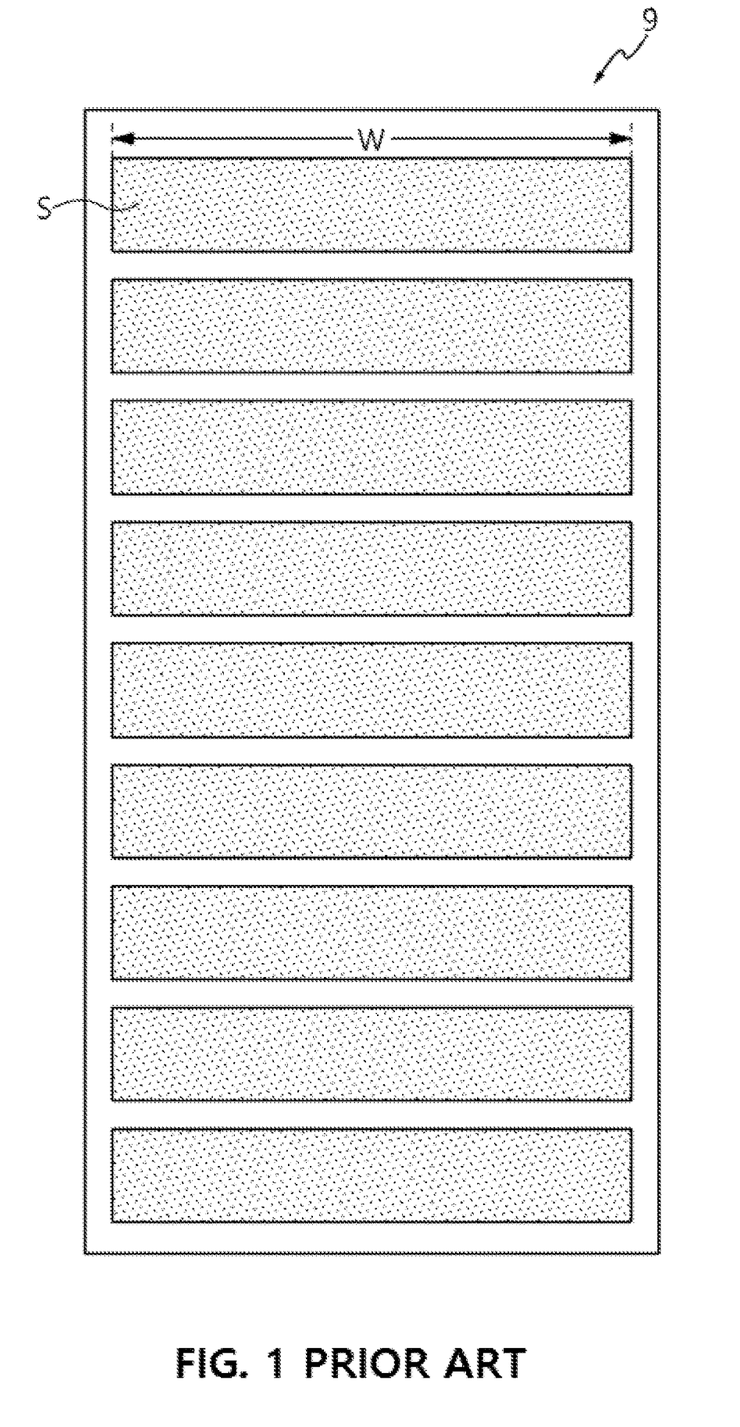
FIG. 1 is a schematic plan view of a conventional RF switch device.

FIG. 1 is a schematic plan view of a conventional RF switch device. Hereinafter, the structure of a conventional RF switch device 9 and problems thereof will be described with reference to FIG. 1.

Referring to FIG. 1, the conventional switch device 9 is designed in a stacked configuration to connect multiple transistors in series to increase the breakdown voltage of the individual transistors and enable the individual transistors to withstand the high voltage operating conditions associated with RF switching. That is, a plurality of stages S are stacked along the length direction (e.g., longest dimension) of the device 9. All of the individual stages S in the device 9 have the same width W.

In this structure, ideally, in the OFF state, the voltage applied to each stage should be equally distributed to the individual stages, but a voltage imbalance may occur due to leakage current flowing to the substrate. To be specific, the greatest amount of current is transferred to the input stage S where the RF signal is input, and the smallest amount of current is transferred to an output stage. Accordingly, a voltage overload may occur in the input stage S, and the voltage applied to each stage S gradually decreases along the RF signal propagation direction (length direction). As such, since the voltage overload already occurs in the input stage S, the maximum power that the device 9 can withstand is controlled by the input stage (i.e., it cannot exceed that of the input stage, and it may deteriorate as the characteristics and/or properties of the input stage deteriorate).

DOCUMENT OF RELATED ART

Korean Patent Application Publication No. 10-2019-0127389, entitled "SEMICONDUCTOR DEVICE AND METHOD OF MANUFACTURING THE SAME"

SUMMARY OF THE INVENTION

The present disclosure has been made to solve the problems of the related art, and an objective of the present disclosure is to provide an RF switch device seeking to reduce or eliminate a voltage imbalance by implementing at least one stage in a stacked switch device with a different width, and thus the voltage applied to each stage in the OFF state may be more equally distributed among the individual stages.

In addition, an objective of the present disclosure is to provide an RF switch device seeking to prevent or at least reduce the likelihood of voltage overload of the input stage of the device by making the width of the input stage smaller than the width in the conventional technology.

Furthermore, an objective of the present disclosure is to provide an RF switch device seeking to reduce or minimize the chip size by including two or more stages in a row of the device, such that at least one of the two or more stages is in an otherwise blank region of the device resulting from reducing the width of a remaining one of the stages in the row.

Furthermore, an objective of the present disclosure is to provide an RF switch device seeking to reduce or prevent voltage imbalance and blank region formation by effectively dividing a single stage.

Furthermore, an objective of the present disclosure is to provide an RF switch device seeking to reduce or prevent voltage imbalance regardless of the input direction of the RF signal by increasing the width of each stage from the first stage to a reference stage, and decreasing the width of each successive stage from the reference stage (e.g., to the output stage).

Technical Solution

The present disclosure may be implemented by various embodiments having one or more of the following configurations in order to achieve one or more of the above-described objectives.

According to one or more embodiments of the present disclosure, an RF switch device includes including a high resistivity substrate; and a plurality of stages, including a gate structure on the substrate; a first deep well having a first conductivity type in the substrate; a second deep well having a second conductivity type on the first deep well; a device (or body) well having the first conductivity type on the second deep well; and a source and a drain having the second conductivity type in a surface of the substrate (e.g., in contact with the device well), adjacent to and on opposite sides of the gate structure, wherein at least one of the plurality of stages may have a width different from a width of other one(s) of the plurality of stages.

According to one or more other embodiments of the present disclosure, a first one of the plurality of stages is an input stage, and the input stage may have a smallest width of the plurality of stages.

According to yet one or more other embodiments of the present disclosure, in the RF switch device, the first deep well of the input stage may have a smaller width than the first deep wells of the other one(s) of the plurality of stages.

According to yet one or more other embodiments of the present disclosure, in the RF switch device, an $n^{th}$ one of the plurality of stages (n may be an integer of at least three) is an output stage, and the widths of the individual stages may increase from the input stage to the output stage.

According to yet one or more other embodiments of the present disclosure, an RF switch device includes a high resistivity substrate; and a plurality of stages, including a gate structure on the substrate; a first deep well having a first conductivity type in the substrate; a second deep well having a second conductivity type on the first deep well; a device (or body) well having the first conductivity type on the second deep well; and a source and a drain having the second conductivity type in a surface of the substrate and adjacent to and on opposite sides of the gate structure, wherein two or more of the plurality of stages are in a row in the RF switch device (e.g., the RF switch device may comprise a plurality of rows, each row includes at least one of the plurality of stages, and one of the rows includes two or more of the stages).

According to yet one or more other embodiments of the present disclosure, in the RF switch device, the plurality of stages may comprise an input stage and an output stage, each of the plurality of stages may have a width that increases from the input stage to the output stage, and the input stage may be in the row.

According to yet one or more other embodiments of the present disclosure, in the RF switch device, the plurality of stages may together have at least three widths, the input stage may have a smallest width, the third stage may have a width different from those of the input stage and (when present) the output stage, and the input stage may be in an otherwise blank region of the row.

According to yet one or more other embodiments of the present disclosure, in the RF switch device, each of the plurality of stages may further include a guard ring around (e.g., surrounding sides of) the device well.

According to yet one or more further embodiments of the present disclosure, in the RF switch device, the guard ring may include a first ring region having the second conductivity type in the substrate (e.g., at the surface of the substrate); and a second ring region having the second conductivity type in contact with the first ring region and/or under the first ring region (e.g., the first ring region is on the second ring region).

According to yet one or more other embodiments of the present disclosure, the RF switch device may further include an isolation film between adjacent ones of the plurality of stages.

According to yet one or more other embodiments of the present disclosure, an RF switch device includes a high resistivity substrate; and a plurality of stages, including a gate structure on the substrate; a first deep well having a first conductivity type in the substrate; a second deep well having a second conductivity type on the first deep well; a device (or body) well having the first conductivity type on the second deep well; and a source and a drain having the second conductivity type in a surface of the substrate (e.g., in contact with the device well), adjacent to and on opposite sides of the gate structure, wherein one of the plurality of stages is an input stage, and the input stage may be divided by n along a width direction (e.g., of the RF switch device).

According to yet one or more other embodiments of the present disclosure, the plurality of stages further comprises an output stage and a third stage, and the third stage is between the input stage and the output stage, and may be divided by m.

According to one or more further embodiments of the present disclosure, in the RF switch device, m<n.

According to yet one or more other embodiments of the present disclosure, the RF switch device may further include an isolation film within a divided one of the plurality of stages (e.g., the input stage and/or the third stage).

According to yet one or more other embodiments of the present disclosure, in the RF switch device, one or more of the stage(s) adjacent to the input stage may also be divided by n, one or more of the stage(s) adjacent to the n-divided stage may be divided by m, and the output stage may not be divided.

According to yet one or more other embodiments of the present disclosure, an RF switch device includes a high resistivity substrate; and a plurality of stages, each including a gate structure on the substrate; a first deep well having a first conductivity type in the substrate; a second deep well having a second conductivity type on the first deep well; a device (or body) well having the first conductivity type on the second deep well; and a source and a drain having the second conductivity type in a surface of the substrate (e.g., in contact with the device well), adjacent to and on opposite sides of the gate structure, wherein the plurality of stages comprise a first stage, a last stage, and a reference stage along a length direction (e.g., of the RF switch device), and a width of each of the plurality of stages may decrease from the reference stage to each of the first stage and the last stage.

According to one or more other or further embodiments of the present disclosure, in the RF switch device, the reference stage may be in a center (e.g., of the RF switch device) along the length direction.

According to yet one or more other or further embodiments of the present disclosure, in the RF switch device, the first stage and the last stage may have substantially the same width.

The present disclosure has the following effects from the above configurations.

The present RF switch device can reduce or eliminate a voltage imbalance by implementing at least one stage in a stacked switch device with a different width, and thus the voltage applied to each stage in the OFF state may be more equally distributed among the individual stages.

In addition, the present RF switch device can reduce or prevent voltage overload of the input stage by making the width of the input stage smaller than the width in the conventional technology (or smaller than the width of one or more other stages).

Furthermore, the present RF switch device can reduce or minimize the chip size by placing two or more stages in a row of the device, such that at least one of the two or more stages is in an otherwise blank region of the device resulting from reducing the width of a remaining one of the stages in the row.

Furthermore, the present RF switch device can reduce or prevent voltage imbalance and blank region formation by dividing one or more stages.

Furthermore, the present RF switch device can reduce or prevent voltage imbalance regardless of the direction in which the RF signal is input by, taking a specific stage as a reference stage, forming the width of each stage to increase from the first stage to the reference stage, and to decrease again from the reference stage to the next stage (or to successive stages).

Meanwhile, it should be added that even if certain effects are not explicitly mentioned herein, the effects described in the following specification and/or expected by the technical features of the present disclosure and their potential effects are treated as if they were described in the present disclosure.

DETAILED DESCRIPTION

Hereinafter, embodiments of the present disclosure will be described in more detail with reference to the accompanying drawings. The embodiments of the present disclosure may be modified in various forms, and the scope of the present disclosure should not be construed as being limited to the following embodiments, but should be construed based on the claims. In addition, these embodiments are only provided for reference in order to more completely explain the present disclosure to those skilled in the art.

As used herein, the singular form may include the plural form, unless the context clearly dictates otherwise. Furthermore, as used herein, "comprise" and/or "comprising" refer to the specific existence of recited shapes, numbers, steps, actions, members, elements and/or groups thereof, and does not exclude the presence or addition of one or more other shapes, numbers, actions, members, elements and/or groups.

Hereinafter, it should be noted that when one component (or layer) is described as being on another component (or layer), the component may be directly on the other component, or one or more third component(s) or layer(s) may be located between the one component and the other component. In addition, when one component is expressed as being directly on or above another component, no other component(s) are located between the one and the other components. Moreover, the terms "top", "upper", "lower", "above", "below", "bottom" or "one (first) side" or "(an) other side" of a component refer to a relative positional relationship.

The terms first, second, third, etc. may be used to describe various items such as various components, regions and/or parts. However, the items are not limited by these terms.

In addition, the conductivity type of a doped region or component may be defined as "p-type" or "n-type" according to the main carrier characteristics, but this is only for convenience of description, and the technical spirit of the present disclosure is not necessarily limited to what is illustrated. For example, hereinafter, "p-type" and "n-type" will be replaced with the more general terms "first conductivity type" and "second conductivity type." Here, the first conductivity type may refer to p-type, and the second conductivity type may refer to n-type.

Furthermore, it should be understood that "high-concentration" and "low-concentration," referring to the concentration of the impurity in a certain region, may refer to the concentration of dopant in one region or component relative to another region or component.

Hereinafter, the "width direction" is understood to mean the x-axis direction in the attached plan views, and the "length direction" is understood to mean the y-axis direction in the attached plan views.

Figure 2:
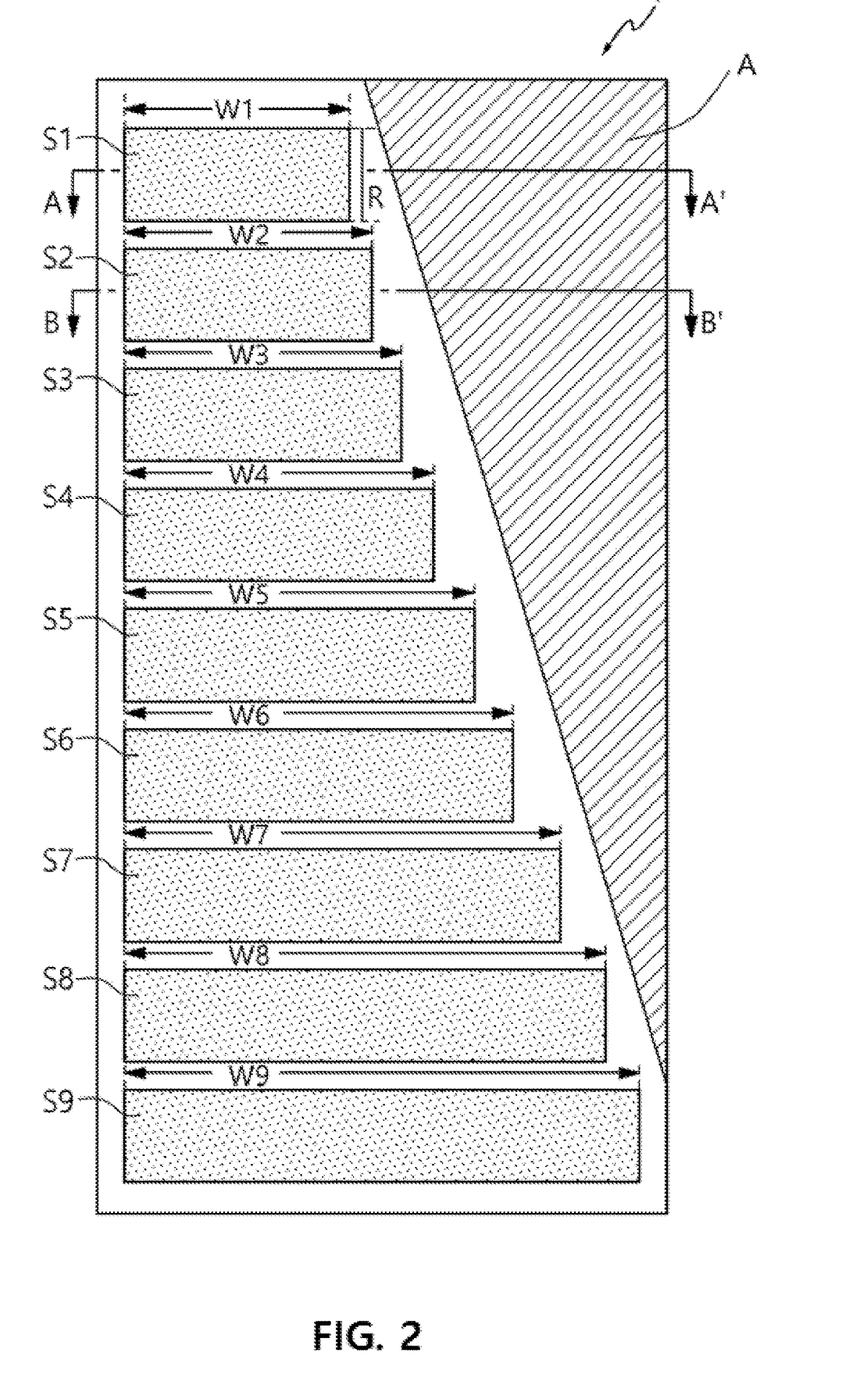
FIG. 2 is a schematic plan view of an RF switch device according to one or more embodiments of the present disclosure.
Figure 3:
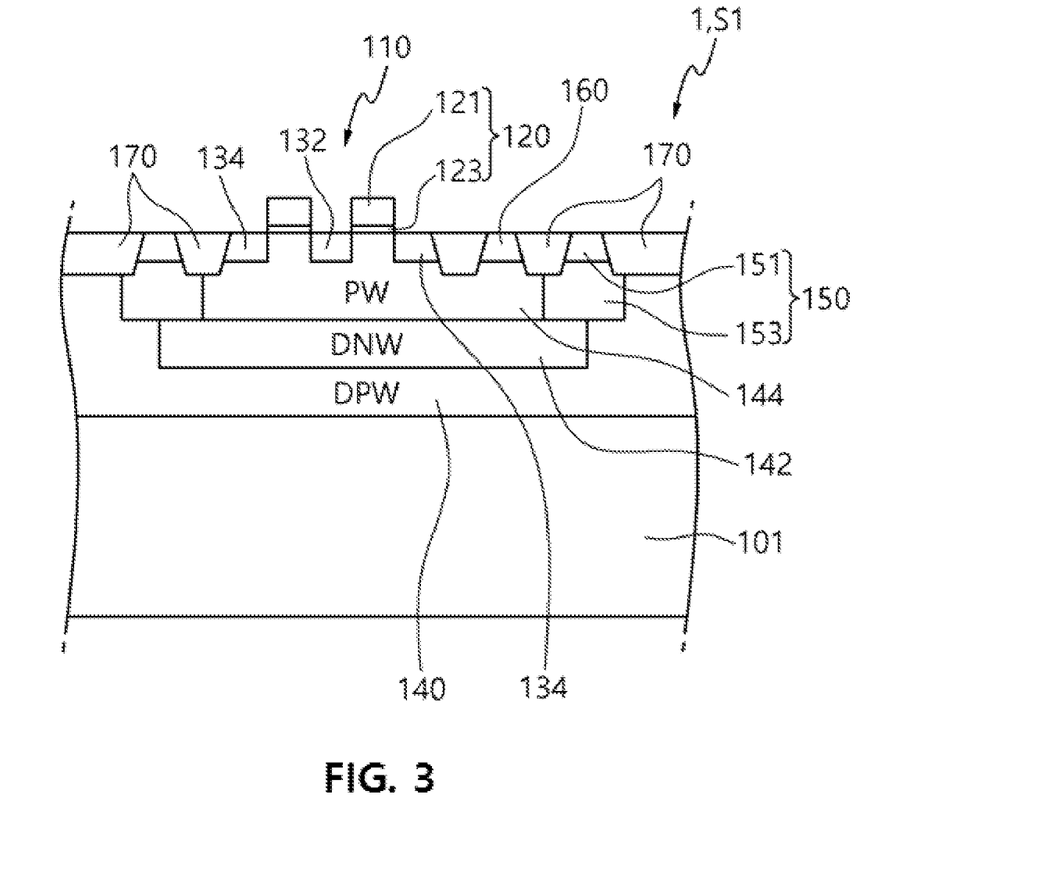
FIG. 3 is a cross-sectional view of the RF switch device of FIG. 2 along the line A-A"
Figure 4:
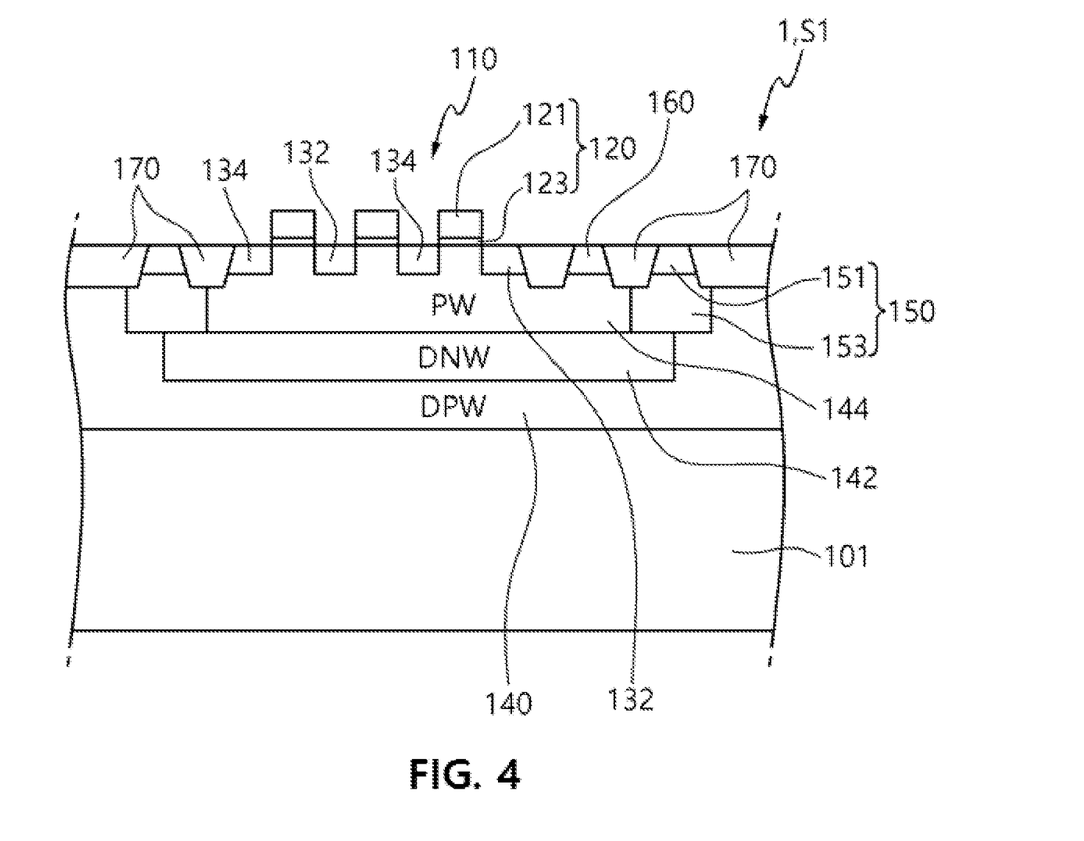
FIG. 4 is a cross-sectional view of the RF switch device of FIG. 2 along the line B-B'.

FIG. 2 is a schematic plan view of an RF switch device according to one or more embodiments of the present disclosure, FIG. 3 is a cross-sectional view of the RF switch device of FIG. 2 along the line A-A", and FIG. 4 is a cross-sectional view of the RF switch device of FIG. 2 along the line B-B'.

Hereinafter, an RF switch device according to one or more embodiments of the present disclosure will be described in detail with reference to the accompanying drawings.

Referring to FIGS. 2 and 4, the present disclosure relates to an RF switch device 1 and, more particularly, to a stacked RF switch device 1 that reduces or eliminates a voltage imbalance by providing at least one stage in the stacked switch device with a different width, and thus the voltage applied to each stage in the OFF state may be more equally distributed among the individual stages.

A "stacked" configuration means that two or more transistors are connected in series to increase the breakdown voltage of the individual transistors and enable the individual transistors to withstand the high voltage operating conditions associated with RF switching, in isolation mode and otherwise. The term "stage" refers to an individual stacked configuration or series circuit in the RF switch. For example, a first transistor, a second transistor, a third transistor, . . . and an nth transistor may be connected in series to form a stacked configuration, or a first stage, a second stage, a third stage, . . . and nth stage are connected in series to form a stacked configuration. Referring to FIG. 2, for example, a total of nine stages, from the first stage S1 to the ninth stage S9, are shown along the length direction, but the number of stages is variable, and the scope of the present disclosure is not limited by the above example. In addition, multiple individual stages S may be further placed in each "row" R generally along the width direction.

Hereinafter, the device structure in a single stage S will be described with reference to FIGS. 3 and 4. First, the substrate (e.g., a high resistivity substrate 101) is described. The substrate 101 may be or comprise a silicon substrate, and may be lightly doped with a first conductivity type impurity such as boron or indium. The resistivity of the substrate 101 is preferably about 1,000 ohm·cm or more, and more preferably 1,000 ohm·cm or more and 20,000 ohm·cm or less.

A field effect transistor 110, for example, may be on the high resistivity substrate 101. To be specific, a plurality of gate structures 120 are spaced apart from each other in the width direction on the substrate 101. The gate structure 120 may include, for example, a gate electrode 121 that includes a polysilicon layer. A gate oxide film 123 may be between the gate electrode 121 and the substrate 101, and a gate spacer (not shown) may be on sidewalls of the gate electrode 121.

The gate spacer may be or comprise, for example, an oxide film, a nitride film, or a combination thereof. The number of gate structures 120 along the width direction within the single stage S may be different for each stage S according to the adjustment of the width W of each stage S, and details thereof will be described later.

In addition, a source 132 and a drain 134 may be on opposite sides of the gate structure 120 and on or at the surface of the substrate 101. The source 132 and the drain 134 may be heavily doped with second conductivity type impurities. In certain transistors in the stage, the source 132 of a downstream transistor in the series and drain 134 of an adjacent upstream transistor may be shared (e.g., as a common ion implantation region). The number of sources 132 and drains 134 may differ in different stages S according to the adjustment of the width W of each stage S.

A first deep well (e.g., a deep p-type well DPW) 140 having a first conductivity type may be in the high resistivity substrate 101, and a second deep well (e.g., a deep n-type well DNW) 142 may be on the first deep well 140. The first deep well 140 may surround lateral sides of the second deep well 142. In addition, a device (or body) well 144 having a first conductivity type may be on the second deep well 142. The field effect transistor 110 may be on the device well 144. The device well 144 may be in electrical contact with one or more lateral sides of the source(s) 132 and the drain(s) 134.

In addition, a guard ring 150 may surround side surfaces of the device well 144. The guard ring 150 may have a first ring region 151 doped with a high concentration of second conductivity type impurities on or at the surface of the substrate 101, and a second ring region 153 doped with second conductivity type impurities and below the first ring region 151. The first ring region 151 contains a higher concentration of impurities than the second ring region 153. The second ring region 153 may be connected to the second deep well 142 and may be at least partially surrounded by the first deep well 140.

A first conductivity type region 160 doped with a high concentration of first conductivity type impurities may be on the device well 144. The first conductivity type region 160 is separate from the source(s) 132 and the drain(s) 134 in the surface of the high resistivity substrate 101, and in an area of the device well 144 adjacent to the guard ring 150. That is, the source 132 and the drain 134 are in the device well 144, and the first conductivity type region 160 may be in an otherwise exposed part of the device well 144 adjacent to the guard ring 150. The first conductivity type region 160 may be used to apply a bias voltage to the device well 144.

In addition, an isolation film 170 may be in the surface of the substrate 101, around the outer periphery of the transistor 110. The isolation film 170 may be at the boundary between adjacent stages S, between the first ring region 151 and an initial drain 134 in the series, between a final source/drain terminal 132/134 in the series and the first impurity region 160, and between the first impurity region 160 and the adjacent first ring region 151. The isolation film 170 may be formed by a shallow trench isolation (STI) process, but is not limited thereto.

Hereinafter, the structure of an RF switch device 9 having a conventional stacked configuration and problems associated therewith will be described.

Referring to FIG. 1, the conventional RF switch device 9 is designed in a stacked configuration to connect multiple transistors in series to increase the breakdown voltage of the individual transistors and enable the individual transistors to withstand the high voltage operating conditions associated with RF switching. That is, a plurality of stages S are stacked along the length direction.

Under this structure, ideally, in the OFF state, the voltage applied to each stage should be equally distributed to the individual stages, but a voltage imbalance may occur due to leakage current flowing to the substrate. To be specific, the greatest amount of current is transferred to the input stage S, where the RF signal is input, and the smallest amount of current is transferred to an output stage. Accordingly, a voltage overload may occur in the input stage S, and the voltage applied to each stage S gradually decreases along the RF signal propagation direction (length direction). As such, since the voltage overload already occurs in the input stage S, the maximum power that the device 9 can withstand is controlled by the input stage (i.e., it cannot exceed that of the input stage, and it may deteriorate as the characteristics and/or properties of the input stage deteriorate).

Referring to FIGS. 2 to 4, in order to solve such a problem, the RF switch device 1 according to the present disclosure is characterized in that the width of each stage may be adjusted. That is, the width W of one or more stages may be different from the width W of one or more other stages. To be specific, the width W1 of the first stage S1 on the signal input side may be smaller than the width W9 of the output stage (e.g., the ninth stage S9).

To describe certain embodiments for this in detail, the width W1 of the first (e.g., input) stage S1 may be smaller than the width W9 of the output stage (e.g., the ninth stage S9), and the width of each of the stages S2 to S9 may gradually increase in the length direction. For example, the width W1 of the first stage S1 may be approximately half or less of the width W9 of the ninth stage S9, so that the width of each stage may gradually increase from the first stage S1 in the length direction. At this time, it is preferable to make the width W9 (e.g., W5+xα, where x is the number of stages between a given stage and the middle/reference stage S5, and α is the incremental increase in the width of a successive stage of the RF switch device 1) of the output side stage S9 longer (e.g., than the middle stage S5) by the reduced width W1 (e.g., W5−xα) of the first stage S1. With such a structure, it is possible to reduce the total current delivered to and/or consumed by the first stage S1, and at the same time, reduce or eliminate the voltage imbalance.

The device 1 in the configuration of FIG. 2 includes a blank region A, containing no transistors or other active device structures. The blank region A leads to inefficient use of space in terms of chip size. The blank region A may be on the input end or side (e.g., next to the first stage S1 in the width direction) and/or in one or more rows R of the stage S adjacent to the input end.

Figure 5:
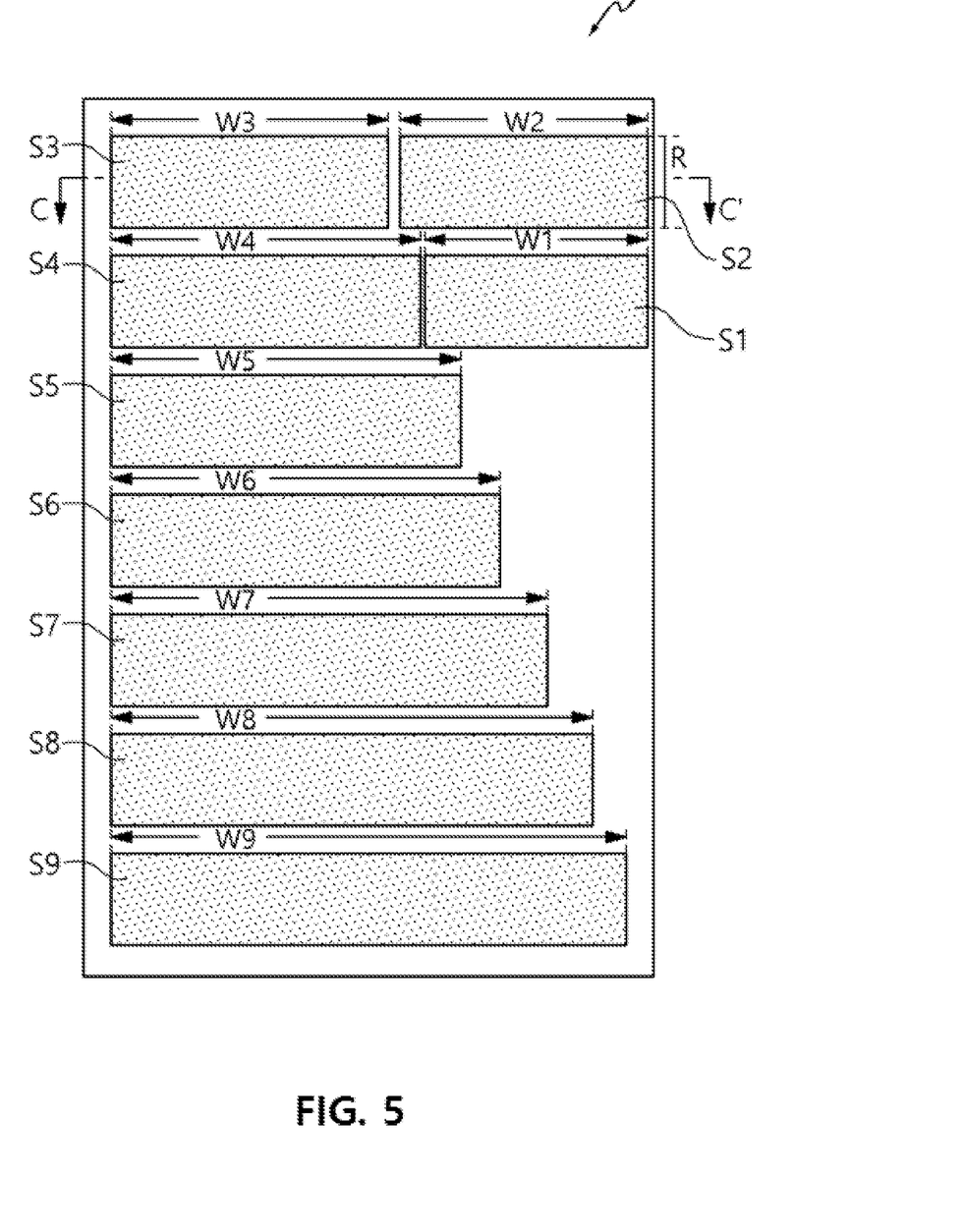
FIG. 5 is a schematic plan view of an RF switch device according to an alternative embodiment of the present disclosure.
Figure 6:
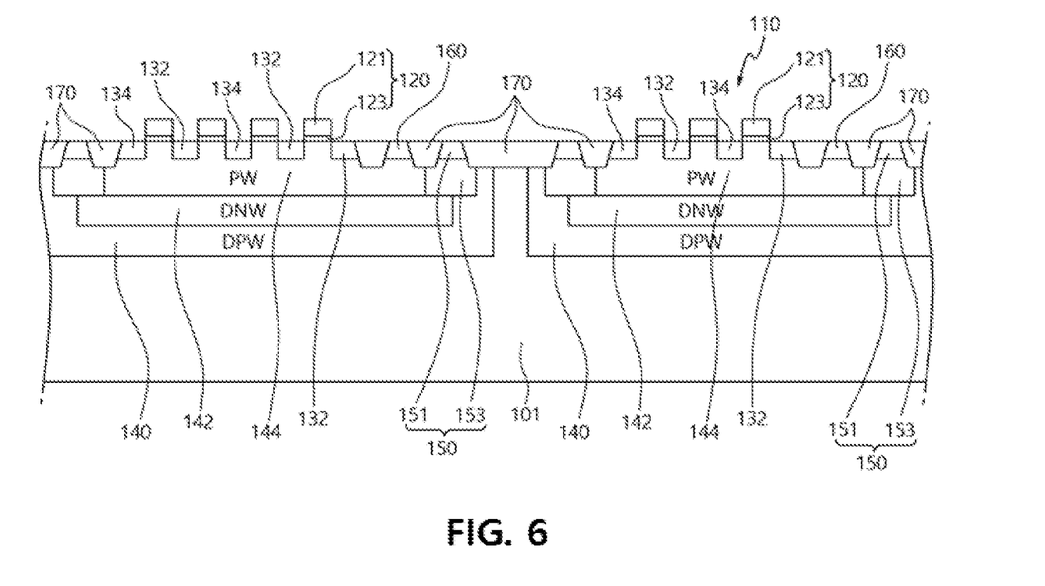
FIG. 6 is a cross-sectional view of the RF switch device of FIG. 5 along the line C-C"

FIG. 5 is a schematic plan view of an RF switch device according to another embodiment of the present disclosure, and FIG. 6 is a cross-sectional view of the RF switch device of FIG. 5 along the line C-C'.

Referring to FIGS. 5 and 6, in this alternative embodiment, one or more rows R may include two or more stages S in order to compensate for the inefficient use of chip space in the embodiment of FIG. 2. That is, an individual stage S having a width W smaller than the width of the blank region A in a given row is included in what would otherwise be the blank region A of the embodiment of FIG. 2. Two or more stages can be placed in the same row when their combined widths are the same or substantially the same as that of the widest stage. For example, the combined widths W1 and W4 of the first and fourth stages S1 and S4 are substantially the same as the width W9 of the last stage S9 (i.e., W9−α<W1+W4<W9+α). Similarly, the combined widths W2 and W3 of the second and third stages S2 and S3 are substantially the same as the width W9 of the last stage S9 (i.e., W9−α<W2+W3<W9+α). Consequently, the second and third stages S2 and S3 are in the same row (e.g., first row R1), and the first and fourth stages S1 and S4 are in the same row (e.g., second row R2). The first stage S1 is in what would otherwise be the blank region A in the second row R2, and the second stage S2 is in what would otherwise be the blank region A in the first row R1 so that successive stages of the device are physically adjacent to each other. With this structure, it is possible to reduce or minimize the overall chip size.

Figure 7:
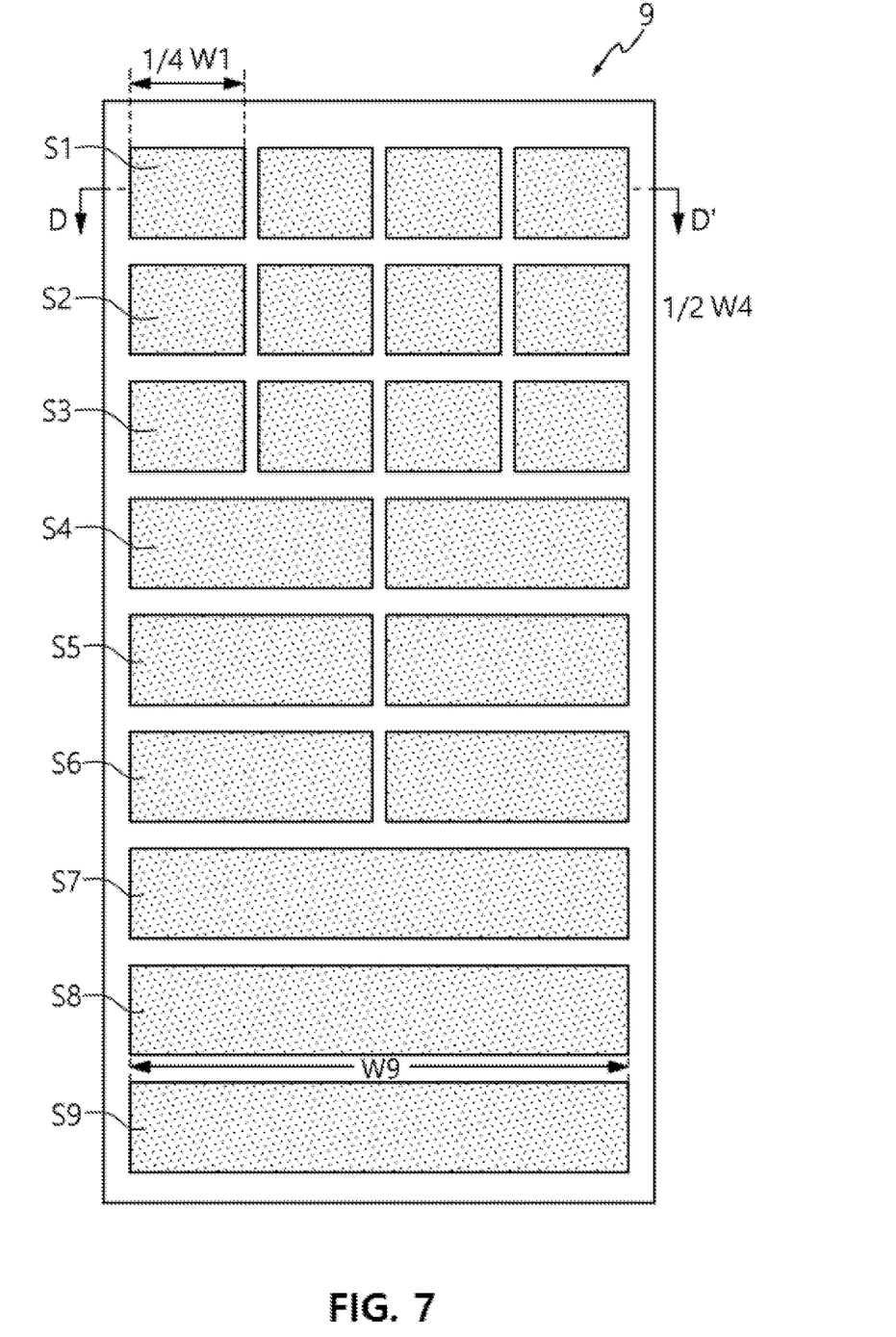
FIG. 7 is a schematic plan view of an RF switch device according to one or more further alternative embodiments of the present disclosure.
Figure 8:
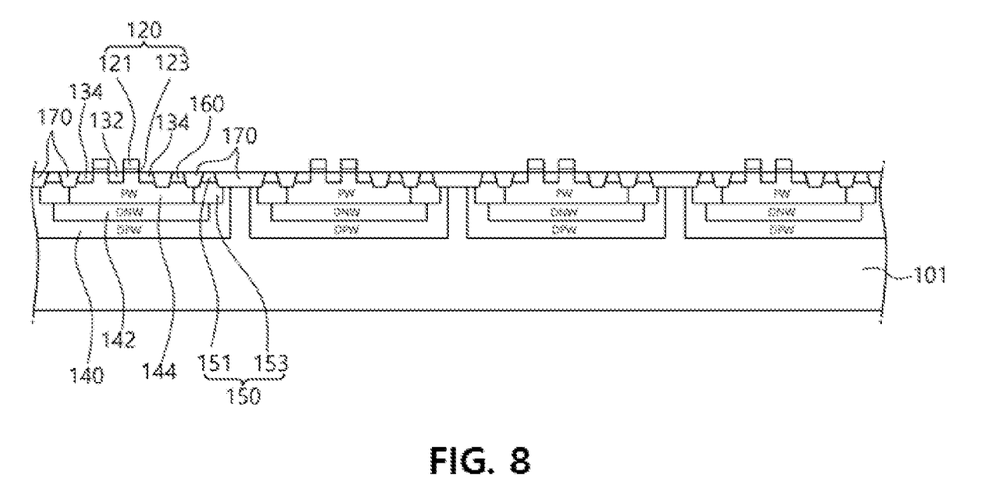
FIG. 8 is a cross-sectional view of the RF switch device of FIG. 7 along the line D-D"

FIG. 7 is a schematic plan view of an RF switch device according to another embodiment of the present disclosure, and FIG. 8 is a cross-sectional view of the RF switch device of FIG. 7 along the line D-D'.

With reference to FIGS. 7 and 8, the input end side or the stage adjacent to the input end is divided by n along the width direction (n is a natural number, for example of two or more). For example, by dividing each of the first stage S1 to the third stage S3 by four along the width direction, the width of the individual stages (¼*W1) may be reduced. Also, the next stage(s) of the n-divided stages are divided by m (m is a natural number). It is preferable that m<n. For example, each of the fourth stage S4 to the sixth stage S6 may be divided by two to reduce the width of the individual stages (½*W4), but larger than that of the first stage S1 to the third stage S3. With such a structure, the blank region A is not formed and, at the same time, voltage imbalance may be reduced or eliminated. In this way, the input stage side stage S1 is divided by n, and stages that are divided by m toward the output side may be present. In each of the embodiments of the present RF switch device, it is assumed that the RF signal is input to the first stage S1 and transferred serially to successive stages to the ninth stage S9.

Figure 9:
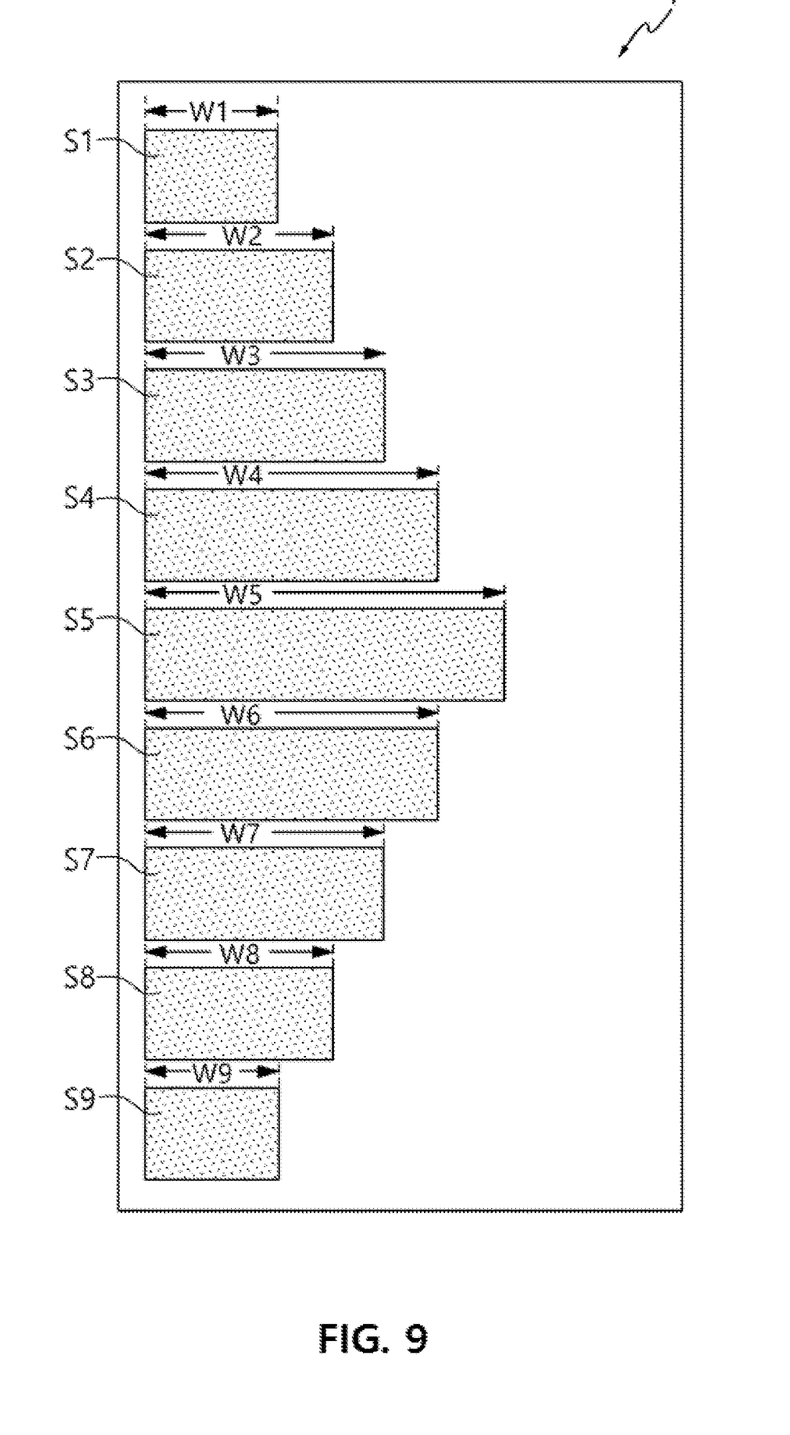
FIG. 9 is a schematic plan view of an RF switch device according to one or more still further alternative embodiments of the present disclosure.

FIG. 9 is a schematic plan view of an RF switch device according to yet another embodiment of the present disclosure.

With reference to FIG. 9, the width of each stage S1-S9 gradually increases from the first stage S1 to successive stages (e.g., to a middle/reference stage; S5 in FIG. 9), but the width of each stage may gradually decrease again from a specific stage (e.g., S5, hereinafter referred to as a "reference stage") to further successive stages. As shown in FIG. 9, the width W1 of the first stage S1 and the width W9 of the ninth/last stage S9 may be substantially the same, but there is no limitation thereto. In FIG. 9, the width of each stage increases from the first stage S1 to the fifth/reference stage S5, and the width of each stage decreases from the fifth stage S5 (reference stage) to the ninth stage S9 (e.g., each stage may have a width of W−xα, where W is the width of the reference stage, x is the number of stages between the reference stage and a given stage, and α is the incremental change in the width of a successive stage of the RF switch device). However, the middle or central stage (the fifth stage S5 in FIG. 9) is not necessarily the reference stage, and the scope of the present disclosure is not limited by the drawings. The reference stage cannot be the first stage or the last stage along the length direction, and the width of the individual stages may decrease toward the first stage and the last stage in the length direction with respect to the reference stage.

Such structure has the advantage of reducing or eliminating the voltage imbalance even when the RF signal is input to the ninth stage S9, as well as when the RF signal is input to the first stage S1. The device structure in a given individual stage S in FIG. 9 may be similar or identical to that of FIGS. 3 and 4, for example.

In addition, referring to FIGS. 3, 4, and 6, the width of each stage S may be defined at least in part by the widths of the first deep well 140, the second deep well 142, and the device well 144. For example, in FIGS. 3 and 4, the widths of the first deep well 140, the second deep well 142, and the device well 144 in the first stage S1 may be smaller than the widths of the first deep well 140, the second deep well 142, and the device well 144 in the second stage S2. In the first stage S1, the number of gate structures 110, sources 132, and drains 134 is also smaller than that of the second stage S2. In addition, the isolation film 170 is in the separation space of each stage along the width direction and the length direction, and when an individual row R includes more than one stage (see, e.g., FIGS. 6 and 8), the isolation film 170 is also in the separation space between adjacent stages in the row.

Figure 10:
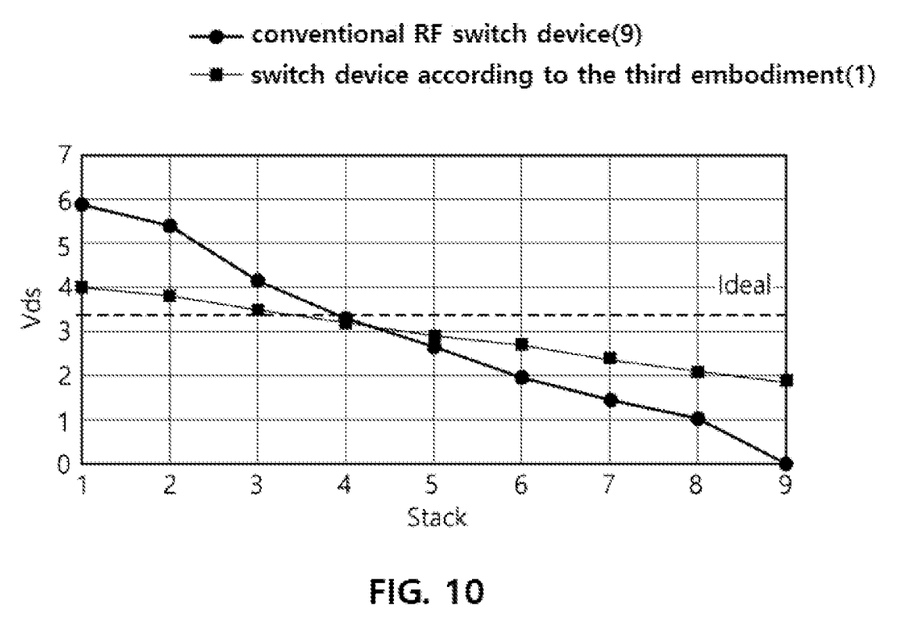
FIG. 10 is a graph showing a comparison of voltage values (e.g., loads) on each stage in the RF switch device according to the embodiment(s) of FIG. 7 and the conventional RF switch device.

FIG. 10 is a graph showing a comparison of voltages on each stage in the RF switch device according to FIGS. 7-8 and the conventional RF switch device.

By configuring in this way, it is possible to have the following effects. Referring to FIG. 10, in the device according to FIGS. 7-8, when the voltage applied to each stage in the OFF state is compared with that of the conventional device 9, the voltage on the input stage S1 is less than that of the conventional device 9, and the voltage applied to each successive stage S after the input stage S1 is relatively smaller than that of the conventional device 9. That is, it is possible to get closer to the ideal voltage equilibrium while avoiding voltage overload in the device according to FIGS. 7-8.

The above detailed description is illustrative of the present disclosure. In addition, the above description shows and describes various embodiments of the present disclosure, and the present disclosure can be used in various other combinations, modifications, and environments. That is, changes or modifications are possible within the scope of the concept of the disclosure disclosed herein, the scope equivalent to the written disclosure, and/or within the scope of skill or knowledge in the art. The above-described embodiments describe various states for implementing the technical idea(s) of the present disclosure, and various changes for specific application fields and uses of the present disclosure are possible. Accordingly, the detailed description of the present disclosure is not intended to limit the present disclosure to the disclosed embodiments.

The invention claimed is:

1. An RF switch device, comprising:
   a high resistivity substrate; and
   a plurality of stages, each comprising:
   a gate structure on the substrate;
   a first deep well having a first conductivity type in the substrate;
   a second deep well having a second conductivity type on the first deep well;
   a device or body well having the first conductivity type on the second deep well; and
   a source and a drain having the second conductivity type in a surface of the substrate, in contact with the device well and on opposite sides of the gate structure,
   wherein the plurality of stages comprises an input stage, an output stage and a third stage, the input stage is divided by n along a width direction, the third stage is between the input stage and the output stage, and the third stage is divided by m, wherein m<n.

2. The RF switch device of claim 1, further comprising: an isolation film within a divided one of the plurality of stages.

3. The RF switch device of claim 1, wherein the output stage is not divided.

* * * * *